United States Patent [19]
Reher et al.

[11] Patent Number: 5,130,699
[45] Date of Patent: Jul. 14, 1992

[54] DIGITAL BATTERY CAPACITY WARNING DEVICE

[75] Inventors: Michael T. Reher, Milwaukee; Ronald C. Klassen, Elm Grove; Bradley N. Koeppel, Watertown, all of Wis.

[73] Assignee: Globe-Union, Inc., Milwaukee, Wis.

[21] Appl. No.: 687,123

[22] Filed: Apr. 18, 1991

[51] Int. Cl.⁵ .............................................. G08B 21/00
[52] U.S. Cl. ..................... 340/661; 324/433; 340/636
[58] Field of Search .................. 340/661, 636; 324/433

[56] References Cited

U.S. PATENT DOCUMENTS 4,017,724  4/1977  Finger .................................. 340/661
4,222,045  9/1980  Cholin ................................. 340/661

Primary Examiner—Glen R. Swann, III
Attorney, Agent, or Firm—Foley & Lardner

[57] ABSTRACT

A voltage monitor and method enables the monitoring of a DC input voltage. The input voltage is continuously scanned and compared to a predetermined threshold. The result of the comparison is periodically stored in a shift register along with previous scan results. When a predetermined number of stored scan results indicate an out of range input voltage, a digital output changes state to provide indication of the abnormal condition.

39 Claims, 1 Drawing Sheet

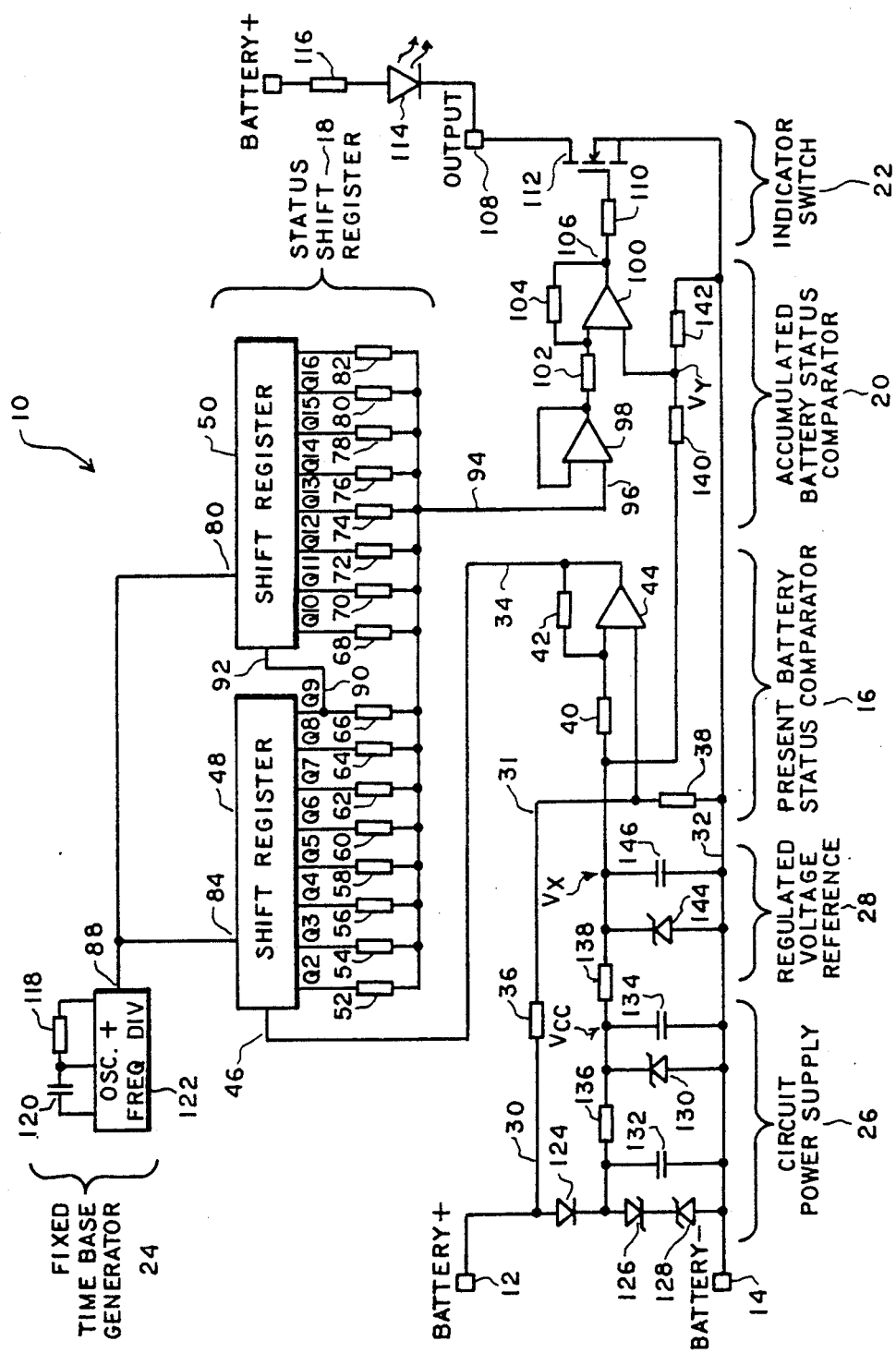

DIGITAL BATTERY CAPACITY WARNING DEVICE

BACKGROUND OF THE INVENTION

The present invention is generally directed to a voltage monitor for sensing a DC voltage and producing a warning that the level of the DC voltage has fallen below a predetermined level for a predetermined percentage of time. The present invention is more particularly directed to monitoring a DC voltage produced by a battery, periodically comparing the battery voltage with a threshold voltage and storing the result of the comparison. If three or more of the last sixteen comparisons indicate a low voltage, the device warns the user of the abnormal condition.

There are many applications where it may be important to sense a voltage level and provide warning of an out-of-range condition. Any DC voltage, whether generated by an AC-to-DC power supply or a depletable source such as a battery may be monitored and a warning provided if the DC voltage varies over time. One such application is a battery-powered smoke detector, where the device could activate a visual or audible warning of a low state-of-charge battery condition.

In another particular application, in the case of a battery used to start an automobile, such a warning may alert the user to an impending "no start" condition, where the battery charge is insufficient to start the automobile. Such a condition may result from a slow drop in the battery's state-of-charge. The reduced charge may be the result of an electrical problem with the car, such as a slipping belt or a failed regulator. Alternatively, the reduced state-of-charge may be the result of battery failure, such as a broken weld or active material shedding. In such an application, a device which senses the abnormal battery voltage can alert the user to the condition so that corrective measures may be taken.

In the preferred embodiment of the present invention, the battery or power source is discharged at a particular current for large portions of time. In the smoke detector application, the battery is powering the smoke detector circuity for the majority of its time, and occasionally being tested or recharged. Similarly, in the Automotive application, the battery is powering electronic hardware during non-use, resulting in a constant discharge current for the majority of the time, interrupted only occasionally by the starting and driving currents. During the constant discharge portion, a battery voltage will change to a value representative solely upon its state-of-charge.

For example, if the digital battery capacity warning device reads the voltage every 2 hours, statistically it will scan at times when the battery is at this constant discharge current and the battery voltage will be representative upon its state-of-charge. In accordance with the preferred embodiment, the warning device scan rate is selected so that two of the sixteen values are taken during the time when the battery may have been in use, as for example, 5% of the time, with the other fourteen values being taken during the time when the battery has not been in use, as for example, 95% of the time.

This device is suited to many other applications where the battery is held at rest or under a constant discharge for significant portions of time. The number of low values can be altered to reflect the percentage of time the battery is not at this constant discharge state. Similarly the frequency of the scans or number of scans can vary based upon how quickly the device is expected to respond to an out-of-limit condition.

Devices for sensing low battery voltage are generally known. U.S. Pat. No. 4,902,956 issued to Sloan on Feb. 20, 1990, describes a voltmeter and circuit breaker wired in series with selected, nonessential accessories of an automobile. The voltmeter monitors the battery voltage and interrupts the flow of current to the accessories when the battery voltage falls below a predetermined threshold. Such devices rely on a single below threshold voltage measurement by the voltmeter to cause the circuit breaker to trip and the accessories to be disconnected from the battery. Unfortunately, conditions unrelated to the battery charge, such as momentary transients in the voltage seen by the apparatus, may cause the circuit breaker to trip. Such voltage transients may be caused by inductive drops caused by suddenly changing current levels, as when an accessory is turned on or off. Alternatively, such momentary drops may occur during starting when the battery voltage may drop to as low as six volts. This sensitivity to voltage transients is an inherent and undesirable limitation on such devices. Moreover, these devices must set their threshold voltage abnormally low to prevent false indications and thereby indicate only when the battery is fully discharged. The present invention can preset the threshold voltage to indicate when the battery state-of-charge is below a predetermined value ranging from 0 to 100% with the knowledge of the battery type and constant discharge current.

SUMMARY OF THE INVENTION

The present invention provides a voltage monitor and warning apparatus and method designed to satisfy the aforementioned needs. The apparatus senses a DC voltage from a battery or other source. The voltage is compared with a predetermined threshold voltage. If the voltage is less than the threshold, a flag is set and stored in a shift register. The sensing and storing procedure is repeated periodically, each time clearing or setting a flag in the shift register. With each comparison, the flags in the shift register are shifted. When three or more of the previous sixteen comparisons have resulted in a flag being set due to a low voltage condition, the digital output of the apparatus changes to indicate the abnormal condition.

Accordingly, the present invention provides a voltage monitor for sensing the output voltage of a voltage source and producing an indication when the output voltage falls below a threshold voltage. The voltage monitor includes a voltage sensing means and a comparing means for comparing the output voltage with the threshold voltage and generating an output when the output voltage is less than the threshold voltage. The voltage monitor further includes a status storage means for storing the output and generating an accumulated status. The voltage monitor still further includes a comparator means for comparing the accumulated status with a first predetermined number when the output voltage has been sensed a second predetermined number of times. Lastly, the voltage monitor further includes an output means for providing the indication that the accumulated status is equal to or greater than the first predetermined number.

The invention further provides a battery voltage monitor for sensing a varying battery voltage and producing an indication when the battery voltage falls below a first threshold voltage. The battery voltage monitor includes a voltage sensing means and a means for comparing the battery voltage with the first threshold voltage and generating an output when the battery voltage is less than the first threshold voltage. The battery voltage monitor further includes a status storage means for storing the output and generating an accumulated battery status. The battery voltage monitor further includes a comparator means for comparing the accumulated battery status with a second threshold voltage and generating a comparator output when the accumulated battery status is greater than the second threshold voltage. The battery voltage monitor further includes an output means for providing an indication in response to the comparator output. The battery voltage monitor still further includes a threshold generating means for generating the first threshold voltage and the second threshold voltage. Lastly, the battery voltage monitor includes a power supply means for generating a regulated supply voltage level for the means for comparing, for the comparator means, the status storage means and the threshold generating means.

The invention still further provides a method for sensing the output voltage of a voltage source and producing an indication when the output voltage falls below a predetermined threshold voltage. The method includes the steps of sensing the output voltage, comparing the output voltage with the threshold voltage and generating an output when the output voltage is less than the predetermined threshold voltage. The method further includes the steps of storing the output, generating an accumulated status, and comparing the accumulated status with a first predetermined number when the output voltage has been sensed a second predetermined number of times. Lastly, the method includes the step of producing the indication when the accumulated status is equal to or greater than the first predetermined number.

BRIEF DESCRIPTION OF THE DRAWINGS

The features of the present invention which are believed to be novel are set forth with particularity in the appended claims. The invention, together with further objects and advantages thereof, may best be understood by making reference to the following description taken in conjunction with the accompanying drawing, in the sole figure of which identical reference characters indicate identical elements, and wherein the sole figure is a schematic diagram illustrating the manner in which the present invention may be implemented in hardware form in accordance with a preferred embodiment of the present invention.

DESCRIPTION OF THE PREFERRED EMBODIMENT

Referring now to the sole figure, it illustrates a voltage monitor 10 embodying the present invention. The voltage monitor 10 as illustrated is of a type which can be used to repetitively measure a DC voltage and provide an indication when three or more of the previous sixteen measurements have been less than a predetermined threshold voltage. Such a voltage monitor is particularly adapted for monitoring a depletable battery such as is used in a motor vehicle.

The voltage monitor 10 generally includes a positive input 12 and a negative input 14, a present battery status comparator 16, a status shift register 18, an accumulated battery status comparator 20 and an indicator switch 22. The preferred embodiment of voltage monitor 10 further includes a fixed time base generator 24 to provide a clocking signal to the status shift register 18, circuit power supply 26 and regulated voltage reference 28. The voltage between positive input 12 and negative input 14 is the input voltage to be monitored. When accumulated battery status comparator 20 indicates that this input voltage has been below a predetermined threshold during three or more of sixteen measurements, the digital state of indicator switch 22 changes to provide an indication of the abnormal condition.

The present battery status comparator 16 has a first input 30 coupled to positive input 12, a second input 32 coupled to negative input 14, and an output 34. It includes resistors 36, 38, 40, 42 and operational amplifier 44. These circuit elements are configured as a voltage comparator with hysteresis of a type well-known in the art. A voltage linearly proportional to the voltage at positive input 12 is present at input 31. The magnitude of the voltage at input 31 is continuously compared with the predetermined threshold voltage Vx. So long as this input voltage remains greater than threshold voltage Vx, the output of the present battery status comparator 16 remains low. In accordance with this preferred embodiment, the low state corresponds to the potential at negative input 14. When the voltage at input 31 falls below the threshold voltage Vx, the output of the present battery status comparator 16 changes to a high state. In the preferred embodiment, the high state corresponds to the potential at output Vcc of the circuit power supply 26. If the voltage at input 31 later changes to a level greater than threshold voltage Vx, the output of present battery status comparator 16 will return to a low state. Such a change may result if the input voltage experienced a momentary reduction in its magnitude, perhaps due to a heavy load placed on the voltage source, as during starting an automobile.

The output 34 of present battery status comparator 16 is coupled to the input 46 of status shift register 18. Status shift register 18 preferably comprises first digital shift register 48, second digital shift register 50 and resistors 52 through 82. First digital shift register 48 and second digital shift register 50 have clock inputs 84 and 86, respectively, coupled to output 88 of fixed time base generator 24. Output 90 of first digital shift register 48 is coupled to input 92 of digital shift register 50 to provide sixteen bit shift register capacity.

First digital shift register 48 and second digital shift register 50 each preferably comprise eight one-bit storage locations which are ordered sequentially from lowest to highest. Each digital shift register preferably has eight data outputs, Q2-Q9 and Q10-Q17, coupled to and corresponding to the eight one-bit storage locations, in order that the contents of each storage location may be detected. The input of each digital shift register is coupled to the lowestordered storage location. Each digital shift register responds to a clock signal by incrementing the contents of the digital shift register. That is, each digital shift register discards the contents of the highest-ordered storage location, moves the contents of each storage location to the next-highest-ordered storage location, and stores the digital data present at the input in the lowest-ordered storage location.

In accordance with this preferred embodiment of the present invention, fixed time base generator 24 periodically provides a clock signal to first digital shift register 48 and second digital shift register 50 at a predetermined frequency. This frequency is preferably one cycle per two hours, but may be faster or slower as required.

When first digital shift register 48 and second digital shift register 50 receive the clock signal at clock inputs 84 and 86, respectively, the contents of each digital shift register are incremented and the digital state present at input 46 is stored in the lowest-ordered storage element of first digital shift register 48. The contents of the highest-ordered storage location of first digital shift register 48 are stored in the lowest-ordered storage location of second digital shift register 50. The contents of the highest-ordered storage location of second digital shift register 50 are discarded. Together, first and second digital shift registers 48 and 50 form sixteen-bit status shift register 18.

The digital output of the present battery status comparator 16 is periodically scanned and stored. The previous sixteen scans are stored. Each scan saves the present comparator output and discards the oldest. The stored digital values are available at the outputs Q2-Q17 of digital shift registers 48 and 50.

The sixteen digital outputs Q2-Q17 of digital shift registers 48 and 50 are coupled together through resistors 52-82 to output 94 of status shift register 18. Preferably, the digital outputs Q2-Q17 have as their low value the potential at negative input 14 and as their high value the power supply voltage Vcc of the circuit power supply 26. By coupling together the sixteen digital shift register outputs Q2-Q17, output 94 of status shift register 18 may take on any of sixteen discrete values between the potential at negative input 14 and Vcc. If all of outputs Q2-Q17 have a low value, output 94 will have the same low value. If all of outputs Q2-Q17 have a high value, output 94 will have a high value. The value of output 94 will increase in a linear stepwise fashion as additional ones of the outputs Q2-Q17 take on a high value.

Output 94 of status shift register 18 is coupled to input 96 of accumulated battery status comparator 20. In the preferred embodiment, accumulated battery status comparator 20 includes operational amplifiers 98 and 100, resistors 102 and 104 and output 106. Operational amplifier 98 is configured as a voltage follower with unity gain, in a manner well-known in the art. Operational amplifier 100 is configured with resistors 102 and 104 as a voltage comparator with hysteresis, as is well-known in the art. Operational amplifier 100 compares the output of operational amplifier 98 with a threshold voltage Vy. Threshold voltage Vy is derived from and is a fraction of threshold voltage Vx. When the voltage at the output 94 of status shift register 18, as buffered by operational amplifier 98, is less than threshold voltage Vy, output 106 of accumulated battery status comparator 20 is low. When the voltage at the output 94 of shift register 18 becomes greater than threshold voltage Vy, output 106 of accumulated battery status comparator 20 changes to a high state. This change of state indicates that at least three of the sixteen digital outputs Q2-Q17 of digital shift registers 48 and 50 are high. In other words, at least three of the previous sixteen scans of the input voltage have resulted in below-threshold measurements, setting flags in status shift register 18. Output 106 of accumulated battery status comparator 20 will be at a low state when fourteen or more of digital outputs Q2-Q17 are low, indicating a normal input condition.

When output 106 changes to its high state, indicator switch 22 changes the state of output 108. Indicator switch 22 includes resistor 110 and metaloxide semiconductor field-effect transistor 112. Resistor 110 provides a current limit to the gate of transistor 112. Transistor 112 is configured to provide an open drain transistor output switch for the purpose of indicating accumulated battery status. Output 108 may thus be connected to another apparatus such as light emitting diode 114 and current limiting resistor 116 to provide a visual indication of the lowvoltage condition.

In accordance with this preferred embodiment, the fixed time base generator 24 preferably includes resistor 118, capacitor 120 and oscillator and frequency divider 122. Resistor 118 and capacitor 120 set the base frequency for oscillator and frequency divider 122. Fixed time base generator 24 provides a clock signal to status shift register 18. This clock signal has a frequency, derived from the base frequency by oscillator and frequency divider 122, that is preferably one cycle per two hours. This is the frequency at which the input voltage is scanned.

Circuit power supply 26 preferably includes diodes 124, 126, 128 and 130, capacitors 132 and 134, and resistor 136. Diodes 124, 126 and 128 and capacitor 132 provide transient suppression, reverse voltage protection and noise filtering of the power supply. Resistor 136, diode 130 and capacitor 134 function to provide voltage-regulated power for operational amplifier 44, first digital shift register 48, second digital shift register 50, operational amplifier 98, operational amplifier 100, and oscillator and frequency divider 122, in the form of voltage Vcc. Voltage Vcc is preferably regulated to be a substantially constant five volts above negative input 14, without regard to the actual input voltage at positive input 12. Voltage Vcc is provided as the positive power supply voltage to operational amplifier 44, first digital shift register 48, second digital shift register 50, operational amplifier 98, operational amplifier 100, and oscillator and frequency divider 122. These circuit elements have the voltage at negative input 14, generally system ground, as their negative power supply voltage. Hence, circuit power supply 26 functions to maintain the potential difference between Vcc and system ground at five volts.

Regulated voltage reference 28 preferably includes resistors 138, 140 and 142, diode 144 and capacitor 146. The output voltages of regulated voltage reference 28 are threshold voltage Vx and threshold voltage Vy. Preferably, threshold voltages Vx and Vy are both temperature and voltage compensated in order that their values will not vary substantially with variations in ambient temperature or input voltage. As previously mentioned, threshold voltages Vx and Vy are the threshold voltages for present battery status comparator 16 and accumulated battery status comparator 20, respectively.

From the foregoing, it can be seen that the present invention provides a voltage monitor and warning apparatus and method for repetitively scanning a DC voltage, comparing with a predetermined threshold voltage, and providing an indication when the DC voltage is less than the threshold voltage during three or more of sixteen successive scans.

While a particular embodiment of the present invention has been shown and described, modifications may be made, and it is therefore intended in the appended claims to cover all such changes and modifications which fall within the true spirit and scope of the invention.

What is claimed is:

1. A voltage monitor for sensing the output voltage of a voltage source and producing an indication when said output voltage falls below a threshold voltage, said voltage monitor comprising:

voltage sensing means for sensing said output voltage and including means for comparing said output voltage with said threshold voltage and generating an output when said output voltage is less than said threshold voltage;

status storage means coupled to said voltage sensing means for storing said output and generating an accumulated status;

comparator means for comparing said accumulated status with a first predetermined number when said output voltage has been sensed a second predetermined number of times; and output means for providing said indication when said accumulated status is equal to or greater than said first predetermined number.

2. A voltage monitor as defined in claim 1 wherein said status storage means comprises a plurality of storage means for storing a like plurality of said first comparator outputs.

3. A voltage monitor as defined in claim 2, wherein each of said plurality of storage means has an associated order, said order being from highest to lowest, and wherein said status storage means is responsive to a clock signal for discarding the contents of the highest-ordered of said storage means, sequentially moving the contents of each of said storage means to the next highest-ordered storage means, and storing said first comparator output in the lowest-ordered of said storage means.

4. A voltage monitor as defined in claim 3 further comprising a timing means for generating said clock signal.

5. A voltage monitor as defined in claim 3 wherein said status storage means comprises a shift register.

6. A voltage monitor as defined in claim 1 further comprising a threshold generating means for generating said threshold voltage.

7. A voltage monitor as defined in claim 1 wherein said means for comparing comprises a voltage comparator.

8. A voltage monitor as defined in claim 1 wherein said comparator means comprises a voltage comparator.

9. A voltage monitor as defined in claim 1 wherein said output means includes a field effect transistor.

10. A battery voltage monitor for sensing a depletable battery voltage and producing an indication when said battery voltage falls below a first threshold voltage, said battery voltage monitor comprising:

threshold generating means for generating said first threshold voltage and a second threshold voltage; and voltage sensing means for sensing said battery voltage, including means for comparing said battery voltage with said first threshold voltage and generating an output when said battery voltage is less than said first threshold voltage;

status storage means coupled to said voltage sensing means for storing said output and generating an accumulated battery status, said accumulated battery status comprising a voltage representing the number of times said battery voltage was sensed to be less than said first threshold voltage;

comparator means for comparing said accumulated battery status with said second threshold voltage and generating a comparator output when said accumulated battery status is greater than said second threshold voltage;

output means responsive to said comparator output for providing said indication;

power supply means for generating a regulated supply voltage level and coupled to said means for comparing, said comparator means, said status storage means and said threshold generating means.

11. A battery voltage monitor as defined in claim 10 wherein said status storage mean comprises a plurality of storage means for storing a like plurality of said first comparator outputs in response to a clock signal.

12. A battery voltage monitor as defined in claim 11 further comprising a timing means for generating said clock signal.

13. A battery voltage monitor as defined in claim 12 wherein said status storage means comprises a shift register.

14. A battery voltage monitor as defined in claim 11 wherein said means for comparing is a voltage comparator.

15. A battery voltage monitor as defined in claim 14 wherein said comparator means is a voltage comparator.

16. A battery voltage monitor as defined in claim 10 wherein said output means is a field effect transistor.

17. A method for sensing the output voltage of a voltage source and producing an indication when said output voltage falls below a predetermined threshold voltage, said method comprising:

sensing said output voltage;

comparing said output voltage with said threshold voltage and generating an output when said output voltage is less than said threshold voltage;

storing said output and generating an accumulated status;

comparing s id accumulated status with a first predetermined number when said output voltage has been sensed a second predetermined number of times; and producing said indication when said accumulated status is equal to or greater than said first predetermined number.

18. A method for sensing a depletable battery voltage and producing an indication when said battery voltage falls below a first threshold voltage, said method comprising:

sensing said battery voltage;

comparing said battery voltage with said first threshold voltage and generating an output having a first state when said battery voltage is less than said first threshold voltage and a second state when said battery voltage is more than said first threshold voltage;

periodically storing said output;

combining said stored output to generate an accumulated battery status voltage;

comparing said accumulated battery status voltage with a second threshold voltage; and producing said indication when said accumulated battery status voltage is greater than said second threshold voltage.

19. A method as defined in claim 18 including the further step of generating a clock signal to clock said periodic storing of said output.

20. A method as defined in claim 18 including the further step of maintaining said first threshold voltage and said second threshold voltage constant against variations in supply voltage and temperature.

21. A voltage monitor for sensing a voltage source output voltage and producing an indication upon an abnormal condition of said voltage source output voltage, said voltage monitor comprising:
  voltage sensing means for sensing said voltage source output voltage;
  first comparator means for comparing said voltage source output voltage with a threshold voltage and generating a first output when said voltage source output voltage is less than said threshold voltage;
  status storage means coupled to said voltage sensing means for storing a preselected number of said first outputs and generating an accumulated value; and
  second comparator means coupled to said status storage means for comparing said accumulated value with a predetermined value and generating said indication when said accumulated value is equal to or greater than said predetermined value.

22. A voltage monitor as define din claim 21 wherein said status storage means comprises a plurality of sub-storage means for storing a like plurality of said first outputs.

23. A voltage monitor as defined in claim 22, wherein each of said plurality of sub-storage means has an associated order, said associated order being from highest to lowest, and wherein said status storage means is responsive to a clock signal for discarding the contents of the highest-ordered of said sub-storage means, sequentially moving the contents of each of said sub-storage means to the next highest-ordered said sub-storage means, and storing said first output in the lowest-ordered of said sub-storage means.

24. A voltage monitor as defined in claim 23 further comprising timing means for generating said clock signal.

25. A voltage monitor as defined in claim 23 wherein said status storage means comprises a shift register.

26. A voltage monitor as defined in claim 21 further comprising a threshold generating means for generating said threshold voltage.

27. A voltage monitor as defined in claim 21 wherein said second comparator means comprises a voltage comparator.

28. A voltage monitor as defined in claim 21 wherein said second comparator means comprises a voltage comparator.

29. A voltage monitor as defined in claim 21 wherein said second comparator means includes one of: a filed effect transistor and a bipolar transistor.

30. A battery voltage monitor for sensing a depletable battery voltage and producing an indication when said depletable battery voltage signifies an abnormal condition, said battery voltage monitor comprising:
  threshold generating means for generating a first threshold voltage and a second threshold voltage;
  voltage sensing means coupled to said threshold generating means for sensing said depletable battery voltage;;
  first comparator means coupled to said voltage sensing means for comparing said depletable battery voltage with said first threshold voltage and generating a first output when said depletable battery voltage is less than said first threshold voltage;
  status storage means coupled to said first comparator means for storing a preselected number of said first outputs and generating an accumulated battery value;
  second comparator means coupled to said status storage means and said threshold generating means for comparing said accumulated battery value with said second threshold voltage and generating said indication when said accumulated battery value is greater than said second threshold voltage; and
  power supply means for generating a regulated supply voltage level and coupled to said first comparator means, said second comparator means, said status storage means and said threshold generating means.

31. A battery voltage monitor as defined in claim 30 wherein said status storage means comprises a plurality of sub-storage means for storing a like plurality of said first outputs in response to a clock signal.

32. A battery voltage monitor as defined in claim 31 further comprising a timing means for generating said clock signal.

33. A battery voltage monitor as defined in claim 32 wherein said status storage means comprises a shift register.

34. A battery voltage monitor as defined in claim 31 wherein said first comparator means is a voltage comparator.

35. A battery voltage monitor as defined in claim 34 wherein said second comparator means is a voltage comparator.

36. A method for sensing a voltage source output voltage and producing dan indication when said voltage source output voltage signifies an abnormal condition, said method comprising:
  sensing said voltage source output voltage;
  comparing said voltage source output voltage with a first threshold voltage and generating a first output when said voltage source output voltage is less than said first threshold voltage;
  storing a preselected number of said first outputs and generating an accumulated value;
  comparing said accumulated value with a predetermined value and generating a second output; and
  producing said indication when said accumulated value is equal to or greater than said predetermined value.

37. A method for sensing a depletable battery voltage and producing an indication when said depletable battery voltage signifies an abnormal condition, said method comprising:
  sensing said depletable battery voltage;
  comparing said depletable battery voltage with a first threshold voltage and generating a first output having a first state when said depletable battery voltage is less then said first threshold voltage and a second state when said depletable battery voltage is more than said first threshold voltage;
  periodically storing said first output;
  combined said stored output to generate an accumulated battery status voltage; and
  producing said indication when said accumulated battery status voltage is greater than a second threshold voltage.

38. A method as defined in claim 37 including a further step of generating a clock signal to clock said periodic storing of said first output.

39. A method as defined in claim 37 including the further step of maintaining said first threshold voltage and said second threshold voltage constant against variations in supply voltage and temperature.

* * * * *